(12) United States Patent
Bae et al.

(10) Patent No.: US 6,544,652 B2
(45) Date of Patent: Apr. 8, 2003

(54) CYANATE ESTER-CONTAINING INSULATING COMPOSITION, INSULATING FILM MADE THEREFROM AND MULTILAYER PRINTED CIRCUIT BOARD HAVING THE FILM

(75) Inventors: Sang-Jun Bae, Kyungki-do (KR); Choong-Nam Park, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/879,083

(22) Filed: Jun. 13, 2001

(65) Prior Publication Data

US 2002/0197479 A1 Dec. 26, 2002

(30) Foreign Application Priority Data

May 15, 2001 (KR) .......................................... 2001-26402

(51) Int. Cl.$^7$ .......................... B32B 27/38; C08L 63/00; C08G 59/00
(52) U.S. Cl. ....................... 428/413; 428/901; 523/400; 523/414; 524/779; 524/783; 524/789; 528/99; 528/119; 528/412
(58) Field of Search ................................ 524/700, 714, 524/720, 779, 783, 789; 528/95, 99, 119, 412; 428/413, 414, 524, 901; 523/400, 414

(56) References Cited

U.S. PATENT DOCUMENTS

| | | | | | |
|---|---|---|---|---|---|
| 5,811,505 A | * | 9/1998 | McCormick | ................. | 528/55 |
| 5,912,308 A | * | 6/1999 | Das et al. | ................... | 525/480 |
| 5,969,036 A | * | 10/1999 | Dershem | ..................... | 524/701 |
| 6,001,936 A | * | 12/1999 | Barrera et al. | ............... | 525/454 |
| 6,133,377 A | | 10/2000 | Nakamura et al. | | |
| 6,156,831 A | | 12/2000 | Sase et al. | | |

* cited by examiner

*Primary Examiner*—Margaret G. Moore
*Assistant Examiner*—Michael J Feely
(74) *Attorney, Agent, or Firm*—Lowe Hauptman Gilman & Berner, LLP

(57) ABSTRACT

Disclosed are a cyanate ester based resin-containing insulating composition, an insulating film made therefrom and a multilayer printed board having the insulating film. The insulating composition comprises 1–75% by weight of epoxy resin, 1–60% by weight of cyanate ester resin, up to 20% by weight of a filler, a curing agent and a metal catalyst, from which the insulating film can be prepared, and the film-applied multilayer printed board can be manufactured. Use of epoxy resins having excellent electrical properties and cyanate ester based resins having high heat resistance causes the reaction of hydroxy groups in some epoxy resins with cyanate ester, thus forming such net structures as to increase the heat resistance of the insulating composition, the insulating film and the multilayer printed circuit board.

7 Claims, No Drawings

CYANATE ESTER-CONTAINING INSULATING COMPOSITION, INSULATING FILM MADE THEREFROM AND MULTILAYER PRINTED CIRCUIT BOARD HAVING THE FILM

BACKGROUND OF THE INVENTION

1. Field of the Invention

The present invention relates to a cyanate ester based resin-containing insulating composition, an insulating film made therefrom and a multilayer printed circuit board having the insulating film. More specifically, the present invention relates to an insulating composition that contains cyanate ester based resin with high heat resistance, an insulating film prepared therefrom and an insulating film-applied multilayer printed circuit board.

2. Description of the Prior Art

In accordance with a recent trend of miniaturized and digitalized high-frequency electronic apparatuses, electronic parts and boards have been required to have high integration and high density properties. Conventionally, there is known a process for manufacturing a multilayer printed circuit board, in which copper foils are laminated in a press on an internal-layer circuit board having a circuit formed thereon by using as insulating bonding layers several prepreg sheets each prepared by impregnating glass cloth with an epoxy resin, and semi-curing it. This process has, however, had problems including a high cost incurred by large-scale equipment and a long period of time required for molding under heat and pressure by a laminating press, the formation of a fine pattern made difficult by an increased copper thickness due to through-hole plating on an external layer, and high dielectric ratio of the circuit board.

Attention has recently been drawn, as means for solving those problems, to the technique by which organic insulating layers are formed alternately on conductor layers of an internal-layer circuit board for making a multilayer printed circuit board of the build-up type. Therefore, via holes are formed and thus a wiring density is increased according to the build-up process. Additionally, the circuit board having high density and thinner sheet has been made by a laser process. Conventionally, liquid insulation resins and photosensitive insulation resins have been used as the insulating layers in the multilayer board of the build-up type. However, because of the formation of an uneven surface on the insulating layers, and the limited selection of the insulating materials for the preparation of the board, it is referred that a semi-solid dry film type insulating materials are used.

In order to improve heat resistance of dry films used as conventional insulating materials, U.S. Pat. No. 6,133,377 refers to an epoxy resin composition suitable for interlayer insulation in a multilayer printed-wiring board of the build-up type, in which heat resistance of insulating films is improved by use of phenolic resin having triazine ring structures and epoxy resin having three or more functional groups with relatively high heat resistance. But, there is a widely recognized need for insulating layers having increased heat resistance by use of a solder devoid of lead.

SUMMARY OF THE INVENTION

Accordingly, it is an object of the present invention to alleviate the problems as described above and to provide a cyanate ester-containing insulating composition having an improved high heat resistance.

It is another object of the present invention to provide a dry film type insulating film prepared from the cyanate ester-containing insulating composition, which has an improved heat resistance.

It is still another object of the present invention to provide an insulating film-applied multilayer printed circuit board, having an improved heat resistance.

In an aspect of the present invention, there is provided an insulating composition comprising 1–75% by weight of epoxy resin, 1–60% by weight of cyanate ester resin as represented by the following formulas 1 to 5, up to 20% by weight of a filler, a curing agent and a metal catalyst:

Formula 1

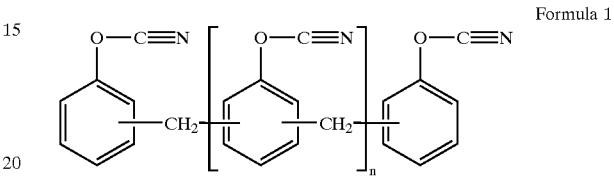

Wherein, n is integral from 1 to 5.

Formula 2

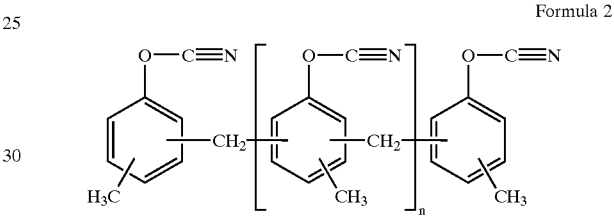

Wherein, n is integral from 1 to 5.

Formula 3

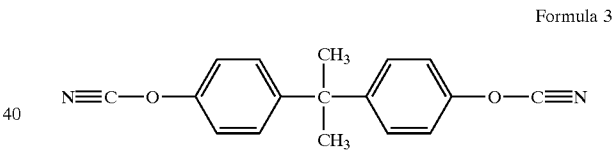

Formula 4

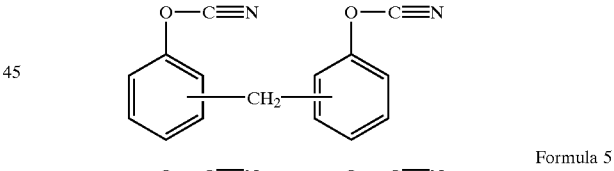

Formula 5

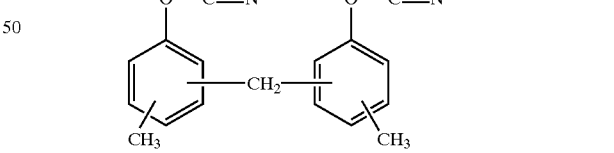

In another aspect of the present invention, there is provided an insulating film prepared from the insulating composition.

In still another aspect of the present invention, there is provided a multilayer printed board having the insulating film.

DETAILED DESCRIPTION OF THE INVENTION

The present inventors have found that, when epoxy resin, cyanate ester based resin and other additives are used together in suitable proportions, heat resistance can be improved. In the present invention, heat resistance is increased by using cyanate ester based resin having high heat resistance, and forming a net structure through a reaction of hydroxy group in some epoxy resins with cyanate ester. Further, metal compounds are used as a catalyst for the above reaction.

Epoxy resin is a thermosetting resin having excellent electrical and thermal properties, and chemical stability, and is used in a printed circuit board. Epoxy resin includes, but is not limited to, for example, bisphenol type epoxy resins such as bisphenol A and bisphenol F, phenol novolak epoxy resins, and cresol novolak epoxy resins and NBR (Nitrile Butadiene Rubber) modified epoxy resins. In particular, in order to improve fire retardation of insulating layers, brominated bisphenol type epoxy resins and brominated phenoxy epoxy resins may be used.

The epoxy resin is used in an amount of 1–75% by weight on a basis of the total weight of the insulating composition, depending on the amounts of cyanate ester based resin. That is to say, in preparing the insulating composition, the remainder comprises epoxy resin and solvent, based on % by weight. For instance, when the amount of cyanate ester based resin is 60% by weight, epoxy resin is added in an amount of 20–40% by weight depending on the amounts of other components, or in an amount of 30–50% by weight when cyanate ester based resin is used in the amount of 50% by weight.

Cyanate ester based resin having superior electrical and thermal properties forms hard thermosetting net structures by cyclotrimerization in cyanate ester groups during curing, thereby increasing heat resistance and dielectric ratio.

Cyanate ester based resins having the following formulas 1 to 5 can be used alone or in a combination of two or more, and, in particular, PT-15, PT-30, PT-30S, PT-60, PT-60S, CT-90, and BA-230S, which are supplied from Lonza Ltd., Switzerland, may be used.

Formula 1

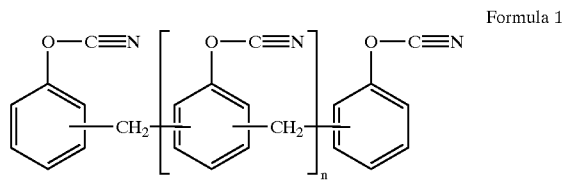

Wherein, n is integral from 1 to 5.

Formula 2

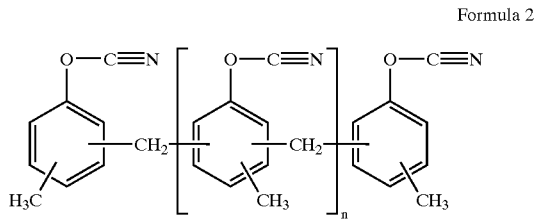

Wherein, n is integral from 1 to 5.

Formula 3

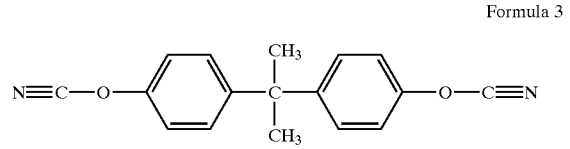

Formula 4

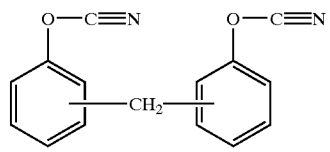

Formula 5

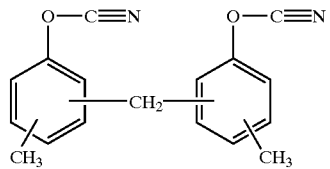

Cyanate ester based resin is used in the amount of 1–60% by weight, and preferably, in the amount of 25–30% by weight, on the basis of the total weight of the insulating composition. If the amount of cyanate ester based resin exceeds 60% by weight, exothermic reaction rapidly occurs, thus the reaction being difficult to control, and economic loss occurring. On the other hand, if the amount is less than 1% by weight, desired effects cannot be obtained, and also mechanical properties are lowered because of yellowing.

Further, the filler to be removed in the desmear process can be used to increase adhesive strength between an insulating layer and a coating layer. The fillers comprising barium sulfate, barium titanate, silicon oxide powder, amorphous silica, talc, clay, mica powder, can be used in the amount of up to 20% by weight, preferably 10 to 15% by weight.

Examples of amines, amides, imidazoles and anhydrous acids useful as the curing agents for epoxy resins, include, but are not limited to, 2-methylimidazole, 2-phenylimidazole, 2-phenyl-4-phenyl imidazole, bis(2-ethyl-4-methylimidazole), 2-phenyl-4-methyl-5-hydroxymethyl imidazole, 2-phenyl-4,5-dihydroxy methyl imidazole, triazine added imidazole, phthalic anhydride, methyl Nadic anhydride, dicyandiamide, tetrahydrophthalic anhydride, methylbutyltetrahydrophthalic anhydride, hexahydrophthalic anhydride, methylhydrophthalic anhydride, trimellitic anhydride, pyromellitic anhydride and benzophenonetetracarboxylic anhydride. The amounts of the curing agents depend on kinds and amounts of epoxy resin, and can be suitably used by a person skilled in the art. That is, the curing agents are added on the basis of equivalents of epoxy resin.

Meanwhile, metal catalysts serving as reaction catalyts of cyanate ester based resin accelerate the curing, and thus cyanate ester based resin is cured at lower temperature. The metal catalysts are exemplified by manganese naphthenate, zinc naphthenate, cobalt naphthenate, nickel naphthenate, cerium naphthenate, manganese octanoate, zinc octanoate, cobalt octanoate, nickel octanoate and cerium octanoate. The amounts of metal catalysts are dependent on the amount of cyanate ester based resin, and may be appropriately used, considering the reaction of cyanate ester based resin, by a person skilled in the art.

The curable insulating composition may be added with general components used to prepare an insulating film, for example, diluents, binders, coupling agents, solvents, antifoaming agents and rubbers, in the amount commonly used in the art.

When the reactive diluents are used, viscosity can be controlled and thus handling becomes easier. The reactive diluents include, but are not limited to, phenyl glycidyl ether, resorcin diglycidyl ether, ethyleneglycol glycidyl ether, glycerol triglycidyl ether, resol type phenol resin or novolak type phenol resin, and isocyanate compounds.

Binders comprise polyacrylic resin, polyamide resin, polyamideimide resin, polycyanate resin and polyester resin.

Upon preparation of the board, silane coupling agents, such as epoxy silane, or titanium coupling agents is used to increase adhesive strength between a conductive layer and an insulating layer.

Examples of the solvents include acetone, methyl ethyl ketone, cyclohexanone, ethyl acetate, butyl acetate, cellosolve acetate, propylene glycol monomethyl ether acetate, ethylene glycol monobutyl ether acetate, cellosolve, butyl cellosolve, carbitol, butyl carbitol, xylene, dimethylformamide and dimethylacetamide, with consideration of solubility and compatibility of the resins and other additives used in the present invention.

In the desmear process for increasing adhesive strength between the insulating layer and the coating layer upon the preparation of the board, the added rubber is swelled and thus allows the filler to be easily discharged, thereby increasing the adhesive strength and improving the elongation ratio. The rubbers comprising polybutadiene rubber, modified polybutadiene rubber, acrylonitrile-butadiene rubber, acrylonitrile-modified polybutadiene rubber and NBR modified epoxy resins can be used alone or in mixture. In addition, the rubbers are used in the amount of 1–20% by weight, based on the total weight of the insulating composition. The rubber amount exceeding 20% by weight results in decrease of the adhesive strength.

The curable heat resistant composition can be coated as solution phase or applied as the insulating layer in a dry film form of semi-solid phase, upon the preparation of the multilayer printed circuit board of the build-up type.

The cyanate ester based resin-containing insulating composition of the present invention can be prepared in the semi-solid dry film form, according to general methods known in the art. In this regard, the composition is formed in the film by use of a roll coater or a curtain coater, and then applied on the board, thus being used as the insulating layer upon the preparation of the multilayer printed board of the build-up type.

For instance, the dry film prepared from the insulating composition of the present invention is laminated on CCL (copper clad laminate) used as an internal layer on the preparation of the multilayer printed board.

A better understanding of the present invention may be obtained in light of the following examples which are set forth to illustrate, but are not to be construed to limit the present invention.

EXAMPLE 1

Preparation of Insulating Composition

Inventive Example 1

54 g of 187 equivalents bisphenol A type epoxy resin, 15 g of 300 equivalents NBR modified epoxy resin and 5 g of 120 equivalents tetra-functional type epoxy resin were placed in a beaker and added with 20 g of MEK (methyl ethyl ketone) and then dissolved. To the dissolved mixture, 13 g of PT-30 (under trademark of Lonza Ltd., Switzerland) and 13 g of BA-230S (under trademark of Lonza Ltd., Switzerland) were added as cyanate ester based resins. After sufficiently dissolving the mixture, 100 ppm cobalt naphthenate and a curing agent were added thereto in a stoichiometric amount, and stirred to prepare an insulating composition.

Inventive Example 2

45 g of 187 equivalents bisphenol A type epoxy resin, 15 g of 300 equivalents NBR modified epoxy resin and 5 g of 120 equivalents tetra-functional type epoxy resin were placed in a beaker and added with 20 g of MEK and then dissolved. To the dissolved mixture, 13 g of PT-30 (under trademark of Lonza Ltd., Switzerland) and 13 g of BA-230S (under trademark of Lonza Ltd., Switzerland) were added. After the mixture was sufficiently dissolved, 9 g of silica, 100 ppm cobalt naphthenate and a curing agent were added in a stoichiometric amount, and milled to prepare an insulating composition.

Inventive Example 3

In a beaker, 55 g of 187 equivalents bisphenol A type epoxy resin, 15 g of 300 equivalents NBR modified epoxy resin and then 20 g of MEK were placed and then dissolved. Thereafter, 15 g of PT-30 (under trademark of Lonza Ltd., Switzerland) and 15 g of BA-230S (under trademark of Lonza Ltd., Switzerland) as resins having cyanate group were added thereto. After the mixture was thoroughly dissolved, 500 ppm cobalt naphthenate and a curing agent were added in a stoichiometric amount, and stirred to prepare an insulating composition.

Inventive Example 4

10 g of 187 equivalents bisphenol A type epoxy resin, 10 g of 300 equivalents NBR modified epoxy resin and 10 g of 120 equivalents tetra-functional type epoxy resin were introduced into a beaker, to which 20 g of MEK was added and then dissolved. The dissolved mixture was added with 30 g of PT-30 (under trademark of Lonza Ltd., Switzerland) and 30 g of BA-230S (under trademark of Lonza Ltd., Switzerland) as resins having cyanate group. After the mixture was thoroughly dissolved, 10 g of silica, 200 ppm cobalt naphthenate and a curing agent were added thereto in a stoichiometric amount, and milled to prepare an insulating composition.

Comparative Example 1

25.5 g of 18S equivalents bisphenol A type epoxy resin, 34 g of 215 equivalents cresol novolak type epoxy resin, 25.5 g of 120 equivalents phenol novolak resin and 13 g of end-epoxidated polybutadiene rubber were mixed with 16 g of MEK and then heated to dissolve. After sufficiently dissolving the mixture, 2-phenol-4,5-bis(hydroxymethyl) imidazole was added as a curing agent, and added with 2 g of silica and milled to yield an epoxy composition.

EXAMPLE 2

Preparation of Insulating Film and Measurement of Heat Resistance

Resin compositions prepared in the inventive examples 1–4 and comparative example 1 in varnish forms were roll-coated on PET film (thickness: 40 $\mu$m), and dried at 80° C. for 10 minutes, to prepare a 50 $\mu$m thick dry film of semi-solid phase, which was then cured according to the curing conditions shown in the following table 1, and thus test pieces were obtained. Heat resistance of the test pieces was measured with DSC analysis method. The results are given in Table 1, below.

TABLE 1

(content: wt %)

| Components | In. Ex. 1 | In. Ex. 2 | In. Ex. 3 | In. Ex. 4 | C. Ex |
|---|---|---|---|---|---|
| Bisphenol A type Epoxy Resin | 54% | 45% | 55% | 10% | 25.5% |
| Tetrafunctional type Epoxy Resin | 5% | 5% | — | 10% | — |
| NBR modified epoxy resin | 15% | 15% | 15% | 10% | |
| Cresol Novolak type Epoxy Resin | — | — | — | — | 34% |
| Cyanate Ester Resin (PT-30) | 13% | 13% | 15% | 30% | — |
| Cyanate Ester Resin (BA-230S) | 13% | 13% | 15% | 30% | — |
| Phenol Novolak Resin | — | — | — | — | 25.5% |
| End-epoxidated polybutadiene rubber | — | — | — | — | 13% |
| Silica | — | 9% | — | 10% | 2% |
| Metal Catalyst | 100 ppm | 100 ppm | 500 ppm | | — |
| Curing Agent | Methyl Nadic anhydride | Methyl Nadic anhydride | Amine diamide | Dicyan | Imidazole |
| Curing Conditions | 120° C./60 min 150° C./60 min | 120° C./60 min 170° C./60 min | 60° C./60 min 120° C./60 min 200° C./60 min | 120° C./60 min 190° C./60 min | 150° C./60 min |
| Tg | 187° C. | 192° C. | 193° C. | 221° C. | 170° C. |

From the above results, it can be seen that the insulating film comprising the epoxy resin and cyanate ester resin-containing insulating composition has higher glass transition temperature than that of insulating films comprising epoxy resin, thereby improving heat resistance.

Epoxy resins having excellent electrical properties are used, along with cyanate ester based resins having high heat resistance, and thus hydroxy groups in some epoxy resins are reacted with cyanate ester, thereby forming net structures. Therefore, the Increased heat resistance of the insulating composition, the insulating film made by the composition and the multilayer printed circuit board having the film can be obtained.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. An insulating composition comprising: 1–75% by weight of epoxy resin; 1–60% by weight of cyanate ester based resin mixture of the following formulas 1 and 3; up to 20% by weight of a filler; a curing agent; and a metal catalyst;

Formula 1:

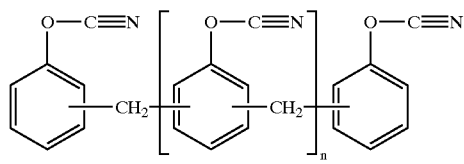

wherein n is integral from 1 to 5;

Formula 3:

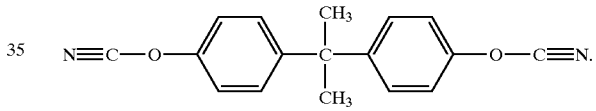

2. The insulating composition as set forth in claim 1, in which said cyanate ester based resin is used in an amount of 25–30% by weight.

3. The insulating composition as set forth in claim 1, in which said filler is selected from the group consisting of barium sulfate, barium titanate, silicon oxide powder, amorphous silica, talc, clay, and mica powder.

4. The insulating composition as set forth in claim 1, in which said curing agent is selected from the group consisting of 2-methylimidazole, 2-phenylimidazole, 2-phenyl-4-phenyl imidazole, bis(2-ethyl-4-methylimidazole), 2-phenyl-4-methyl-5-hydroxymethyl imidazole, 2-phenyl-4,5-dihydroxy methyl imidazole, triazine added imidazole, phthalic anhydride, Methyl Nadic anhydride, dicyandiamide, tetrahydrophthalic anhydride, methylbutyltetrahydrophthalic anhydride, hexahydrophthalic anhydride, methylhydrophthalic anhydride, trimellitic anhydride, pyromellitic anhydride and benzophenonetetracarboxylic anhydride.

5. The insulating composition as set forth in claim 1, in which said metal catalyst is selected from the group consisting of manganese naphthenate, zinc naphthenate, cobalt naphthenate, nickel naphthenate, cerium naphthenate, manganese octanoate, zinc octanoate, cobalt octanoate, nickel octanoate and cerium octanoate.

6. An insulating film prepared from the insulating composition of claim 1.

7. A multilayer printed circuit board having the insulating film of claim 6.

* * * * *